United States Patent
Candy

(10) Patent No.: US 7,227,408 B2
(45) Date of Patent: Jun. 5, 2007

(54) LOW DISTORTION CLASS-D AMPLIFIER USING SAMPLING OF A SERVO-LOOP AMPLIFIER OUTPUT

(75) Inventor: Bruce Halcro Candy, Basket Range (AU)

(73) Assignee: BHC Consulting Pty., Ltd., Glenside (AU)

( * ) Notice: Subject to any disclaimer, the term of this patent is extended or adjusted under 35 U.S.C. 154(b) by 204 days.

(21) Appl. No.: 11/138,896

(22) Filed: May 26, 2005

(65) Prior Publication Data

US 2006/0279357 A1    Dec. 14, 2006

(51) Int. Cl.
*H03F 3/38* (2006.01)
(52) U.S. Cl. .................... 330/10; 330/207 A; 330/151; 375/238
(58) Field of Classification Search ............... 330/10, 330/251, 207 A; 375/238; 370/212
See application file for complete search history.

(56) References Cited

U.S. PATENT DOCUMENTS

| | | | | |
|---|---|---|---|---|
| 4,042,890 A | * | 8/1977 | Eckerle | 330/207 A |
| 5,617,058 A | * | 4/1997 | Adrian et al. | 330/10 |
| 6,064,259 A | * | 5/2000 | Takita | 330/10 |
| 6,127,885 A | * | 10/2000 | Colangelo | 330/10 |
| 6,552,606 B1 | * | 4/2003 | Veltman et al. | 330/10 |
| 6,987,851 B1 | * | 1/2006 | Toumani et al. | 379/339.01 |

* cited by examiner

*Primary Examiner*—Patricia Nguyen
(74) *Attorney, Agent, or Firm*—Osha Liang LLP

(57) ABSTRACT

An electronic class-D amplifier including a pulse width modulator and a servo-loop amplifier characterized in that there is provided a sample and hold element which samples a signal at the sample input when a sample command signal is applied to a control input, and holds the value of the last sampled value of the signal at the sample input when a hold command signal is applied to the control input, and the output of the sample and hold element is connected to a modulation input of the pulse width modulator wherein a negative feedback path connects an output of the output switching stage to an input of the servo-loop amplifier.

21 Claims, 2 Drawing Sheets

LOW DISTORTION CLASS-D AMPLIFIER USING SAMPLING OF A SERVO-LOOP AMPLIFIER OUTPUT

TECHNICAL FIELD

This invention relates to a class-D switching amplifier and has particular application to class-D analogue power amplifiers, particularly audio frequency amplifiers.

BACKGROUND ART

The following descriptions are provided to assist the reader to understand how the current inventor has proceeded to analyse circuits of which he is aware to assist the reader to understand the relevance of the circuit invention. However these references are not intended and do not of themselves provide any admission by the applicant that they are published as may be required for an assessment of novelty or obviousness or are common general knowledge according to the laws of and in any particular country in the world.

Several models of commercial switching amplifiers are known which include class-D amplifiers. Most utilise a system including a first order servo-loop amplifier whose output is connected to a modulation input of a pulse width modulator. An output of the pulse width modulator is connected to an input of an output switching stage. A negative feedback path connects an output of the output switching stage to an input of the servo-loop amplifier and an amplifier input is also connected to an input of the servo-loop amplifier. This system may be viewed conceptually as the output of the servo-loop amplifier, being an integral of an error signal, the error signal being proportional to the difference between the scaled output of the output switching stage and amplifier input signals. This integrated error signal is that which is fed to the said modulation input.

The pulse width modulator in some systems includes a triangular-wave oscillator which acts as a carrier reference signal, which is applied to an input of a comparator. In some systems which are less common, the carrier reference is a sawtooth waveform rather than a triangular-wave. An output of the servo-loop amplifier is also applied to an input of the comparator. The comparator and the triangular wave oscillator act as the said pulse width modulator, wherein an output of the comparator acts as the output of the pulse width modulator. The servo-loop amplifier most often has a forward transfer function which is an input current to output voltage integrator.

This system uses negative feedback to reduce distortion, that is, improve accuracy. However, this system is known intrinsically to produce distortion or in other words non-linearity between the amplifier input and amplifier output forward transfer ratio at frequency components well below the carrier reference signal. That is, the system produces distortion even if perfect electronic components are postulated, or in other words, it can be shown mathematically that there will be distortion for idealised components.

In addition, electronic imperfections which are significant, for example in practical power output switching stages, produce further errors.

Details of a system utilising these basic functions is given in Motorola application note AN1042.

A simpler class-D amplifier with no negative feedback or servo-loop amplifier and direct input signal modulation of the pulse width modulator is utilized by an integrated circuit by Zetex known as the ZXCD1000. In mathematically idealised form, this system is distortion free. That is, assuming all components are ideal in such a system concept, this idealised system is known to produce no distortion, in contrast to the servo-loop system described above. However, this direct modulation system in practice is known to have several problems compared to the servo-loop approach, namely:

The output noise is typically higher owing to feedback not being employed.

The distortion resulting from practical electronic components is higher at low frequencies where the negative feedback of the servo-loop system is of assistance.

The output signal of the direct modulation system is proportional to the output stage supply rails and is thus modulated by variations in these rails. Owing to negative feedback, this effect is reduced in the servo-loop system, particularly at lower frequencies which has the advantage of more negative feedback.

Class-D amplifiers have been developed by Bang and Olufsen which this company calls its "ICEpower" products. The principles of this system are described in numerous Audio Engineering Society publications and patent U.S. Pat. No. 6,297,692. This discloses an analogue switching amplifier, in which the overall amplifier dominant pole is set by elements both in the forward servo-loop amplifier paths and also in the negative feedback paths.

Some Bang and Olufsen ICEpower models 250A, 500A, 250ASP and 500ASP, that I was able to trial illustrated for me at least the following performance results: For example, the distortion at 20 kHz at higher powers but below clipping, into 4 ohms did appear to me to be close to 1% (100 kHz measurement bandwidth). If the results were accurate, this is roughly 2 orders of magnitude worse than typical well designed traditional analogue amplifiers. From my general knowledge of this field, I suspect that the ICEpower units perform relatively well compared to some other brands of class-D amplifier products.

While I have referred to a specific class-D amplifier that is commercially available I am aware that units do vary and as such results should of themselves not be necessarily taken as confirmation, but they do suggest that there is some difficulty with such amplifiers. A circuit utilising the ICEpower basic principles is published in "Radio Technique" December 2002, pages 58–64.

The same publication at pages 140–144 also discloses a common servo-loop system but instead of the servo-loop amplifier being a first order integrator, it is designed as a second order servo-loop system. This offers more feedback at low frequencies. Paradoxically, at higher frequencies, where little additional negative feedback is available relative to the first order system, the distortion is intrinsically worse owing the shape of the signal at the output of the servo-loop amplifier.

In my patent application, PCT/AU2004/000149, I disclosed a class-D amplifier system in which the symmetry of the carrier reference signal is modulated by a processed input signal. In particular, a useful form includes the symmetry modulation of the slopes of a triangular-wave reference signal by the derivative of the input signal. A further disclosure is a further reduction of distortion by means of increased negative feedback gained by implementation of a second order servo-loop amplifier and similar compensating second order integrating element within the integrating element within the carrier reference signal generator.

The reasons for the source of intrinsic distortion in analogue class-D amplifiers is discussed in PCT/AU2004/000149, as too is a description of a useful mechanistic model. This information is useful for the understanding of this alternative means for attaining low distortion.

An object of this invention is therefore to provide an amplifier improvement that assists in reducing distortion or at least provides the public with a useful alternative.

DISCLOSURE OF THE INVENTION

In one form of this invention the invention may be said to reside in an electronic class-D amplifier having
- an amplifier input to which an amplifier input signal may be applied,
- an amplifier output which may produce an amplifier output signal,
- an output switching stage,
- a pulse width modulator which includes an oscillator and a first comparator, at least one servo-loop amplifier, wherein the amplifier input is connected to an input of the servo-loop amplifier which includes an integrating feed forward transfer function,
- characterised in that there is provided a sample and hold element which includes a sample input and a control input, such that the sample and hold element samples a signal at the sample input when a sample command signal is applied to the control input, and the sample and hold element holds the value of the last sampled value of the signal at the sample input when the hold command signal is applied to the control input, and this said held value is applied to an output of the sample and hold element,
- the amplifier input is also connected to a first input signal processor which processes the amplifier input signal,
- wherein a first output of the oscillator produces a carrier reference signal,
- an output of the servo-loop amplifier is connected to the sample input of the sample and hold element,
- the output of the sample and hold element is connected to a modulation input of the pulse width modulator,
- a second output of the oscillator is connected to the control input of the sample and hold element,
- an output of the first input signal processor is connected to an input of the pulse width modulator,
- an output of the pulse width modulator is connected to an input of the output switching stage,
- and an output of the output switching stage is connected to the amplifier output, wherein a negative feedback path connects an output of the output switching stage to an input of the servo-loop amplifier.

In preference the invention is further characterised in that the output of the sample and hold element is connected to an input of the said first comparator,
- and the first output of the oscillator is connected to an input of the first comparator,
- the said first input signal processor being a linear amplifier,
- and an output of the first comparator is an output of the pulse width modulator.

In preference the invention is further characterised in that the sample command occurs in time close to the time of peak signals of the carrier reference signal and the hold command occurs at all other times.

In preference the invention is further characterised to include at least one power supply which supplies power to the output switching stage adapted such that the peak signals of the carrier reference signal track a difference in potential between power supply rails which supply power to the output switching stage.

In preference the invention is further characterised in that the integrating feed forward transfer function of the servo-loop amplifier is at least second order.

In preference the invention is further characterised in that the amplifier input is also connected to an input of a second input signal processor,
- an output of the second signal processor is connected to a modulation input of the oscillator.

In preference the invention is further characterised in that the second signal processor has a forward transfer function which includes a differentiating with respect to time forward transfer function with respect to time,
- and the signal at the modulation input of the oscillator modulates the symmetry of the carrier reference signal.

In preference the invention is further characterised in that a forward gain of the output switching stage, a forward transfer function of the servo-loop amplifier, a forward gain of the sample and hold element, and modulation forward gain of the oscillator and input signal processor, and carrier reference output signal's mean frequency, and gain of the negative feedback path, and the relationship between the timing of the sample command and hold command signals relative of peaks of the carrier reference signal,
- are selected to improve linearity of a signal at the amplifier output relative to a signal applied to the amplifier input.

In preference the invention is further characterised in that the oscillator includes a wide-band amplifier with a unity-gain-bandwidth of at least greater than 100 MHz.

In preference the invention is further characterised in that the mean output carrier reference signal frequency, and peak signals from the output of the output switching stage and potential currents flowing within this stage, are consistent with class-D power audio amplification.

In a further form this invention can be said to reside in a method of amplification which includes the steps of introducing a signal to be amplified into an amplifier as above characterised.

BRIEF DESCRIPTION OF THE DRAWINGS

For a better understanding, further description will now be given, with reference to drawings in which.

BEST MODE FOR CARRYING OUT THE INVENTION

Figure 1:
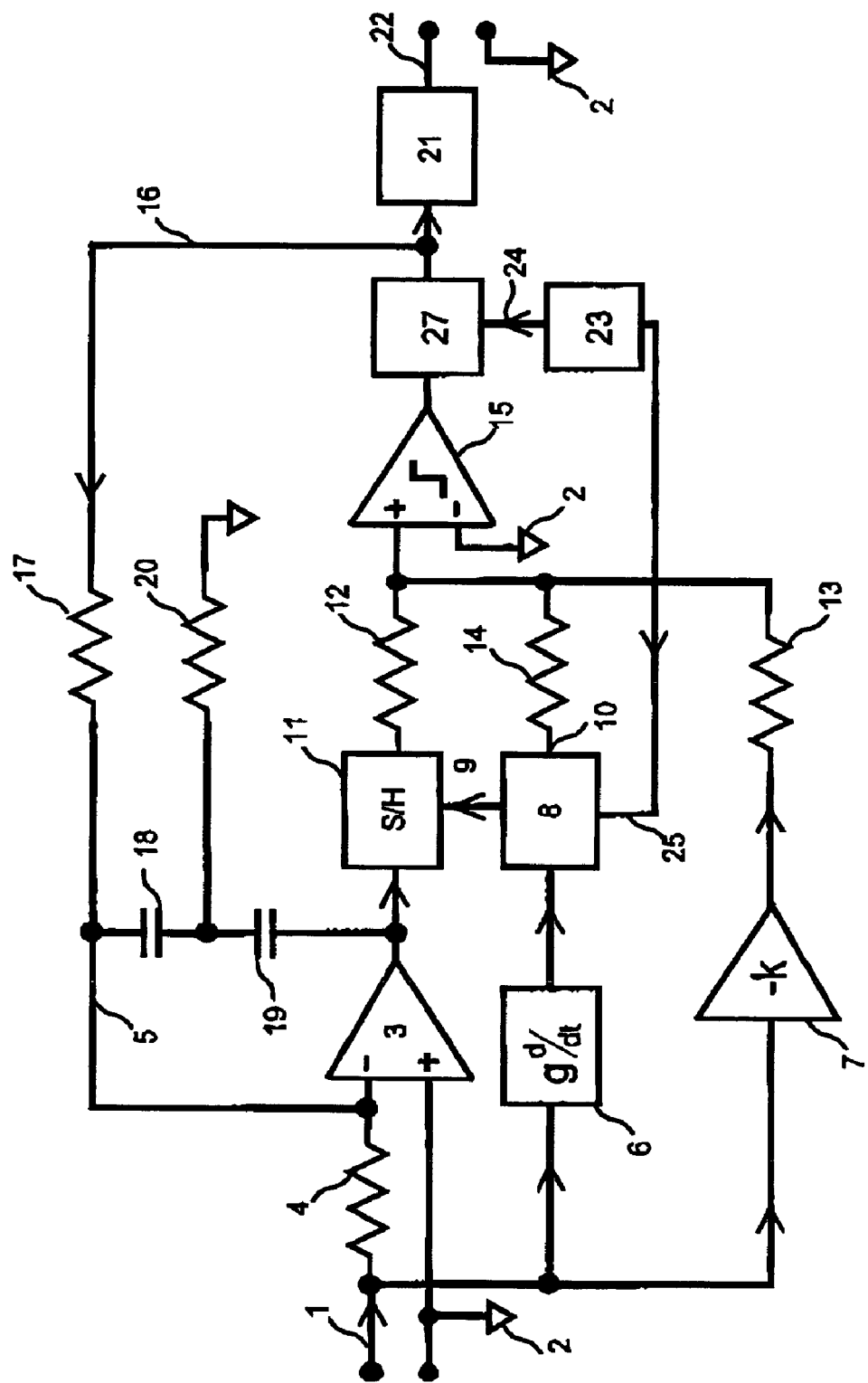
FIG. 1 shows a functional block diagram of the invention.

In FIG. 1 an amplifier input 1 feeds an input of a first input signal processor 7 and an input of a servo-loop amplifier which may be thought of as consisting of operational amplifier 3, resistors 4 and 20, and capacitors 18 and 19. Resistor 4 connects the amplifier input to an inverting input of operational amplifier 3. The amplifier input and amplifier output include an amplifier earth reference 2, which is also connected to a non-inverting input of the operational amplifier 3. Capacitors 18 and 19 are in series and may be thought of as integrating elements of the servo-loop amplifier. These are connected between the inverting input of operational amplifier 3 and its output. Resistor 20 is connected between the earth reference 2 and the node connecting capacitors 19 and 20. This combination forms a second order integrating feed forward transfer function of the servo-loop amplifier. The output of the servo-loop amplifier at the output of operational amplifier 3 is connected to a sample input of a sample and hold element 11. The sample and hold element includes a control input, such that the sample and hold element samples a signal at the sample input when a sample command signal is applied to the control input, and the sample and hold element holds the value of the last sampled value of the signal at the sample input when the hold command signal is applied to the control input, and this said held value is applied to an output of the sample and hold element. Resistor 12 is connected between the output of the sample and hold element 11 and a non-inverting input of a comparator 15. The inverting input of the comparator is connected to the earth reference 2. An output of the comparator 15 is fed to a control input of an output switching stage 27. Resistor 17 is connected between an output 16 of the output switching stage 27, and the inverting input of the servo-loop amplifier. This forms a negative feedback path. The output 16 of the output switching stage 27 is connected to a filter 21 which removes carrier reference related signals and harmonics. In most class-D amplifier products, this is usually a low-pass filter. The output of this filter feeds the amplifier output 22. However, it is not essential to include this filter depending on application.

An output of the first signal processor 7 is connected to an input the comparator 15 via resistor 13. An oscillator 8 which produces a carrier reference signal at a first output 10 is connected to an input of comparator 15 via resistor 14.

This carrier reference signal usually is a triangular-wave signal in most analogue class-D amplifier products. Oscillator 8 produces at a second output relatively short duration sample command signal pulses close in time to the peaks of the carrier reference signal. These short duration sample command signal pulses are applied to a control input 9 of the sample and hold element 11. At all other times, a hold command signal is applied to control input 9.

A combination of oscillator 8, comparator 15 and resistors 12, 13 and 14 may be thought of as a pulse width modulator.

The output switching stage is supplied by power supply 23 via power rail 24. A signal in proportion to the difference in potential between the power rail 24 and earth reference 2 is fed to an input 25 of the oscillator 8, which is adapted such that the peak voltages of the carrier reference triangular-wave signal track this said difference in potential. This feature compensates for power supply voltage variation and modulation, which may occur from, for example, varying current being supplied to the amplifier or un-regulated power supplies.

Whilst the intrinsic (mathematical) cancellation of distortion is substantial for a first order integrating feed forward transfer function servo-loop amplifier, with the value of resistor 20 being infinite, the cancellation is not exact. An improvement can be made when the servo-loop has a second order integrating feed forward transfer function, that is with resistor 20 having a finite value. The value is optimal when relatively high. This causes a small adjustment to signals at the output of the servo-loop amplifier, but of a nature required to cancel most of the residual distortion not dealt with by the features of the sample and hold and feed forward blocks 7 and 13.

Yet another alternative low distortion class-D amplifier may include a combination of the above features and the features disclosed in application PCT/AU2004/000149. This may be achieved by the amplifier input 1 also feeding an input of a second input signal processor 6. An output of the second signal processor 6 is connected to a modulation input of oscillator 8. A signal at this modulation input modulates the symmetry of the carrier reference signal. In the case of a triangular-wave the rising and falling slopes are modulated. This is described in detail in application PCT/AU2004/000149. The usage of the two alternative methods to achieve low distortion may be selected continuously from the extreme of just the application PCT/AU2004/000149 features through the combination of both to just the features described above at the other extreme.

Owing to the relatively high frequency of typical carrier reference signals (>=500 kHz), which no doubt will increase as electronic components improve in future years. It is beneficial for accuracy of the carrier signal and hence of the whole amplifier to utilise a wideband operational amplifier within the oscillator integrating elements owing to the relatively high gains of such devices at the carrier reference signal frequency and its harmonics. For example, a wideband amplifier with a unity-gain-bandwidth of more than 100 MHz is useful.

Figure 2:
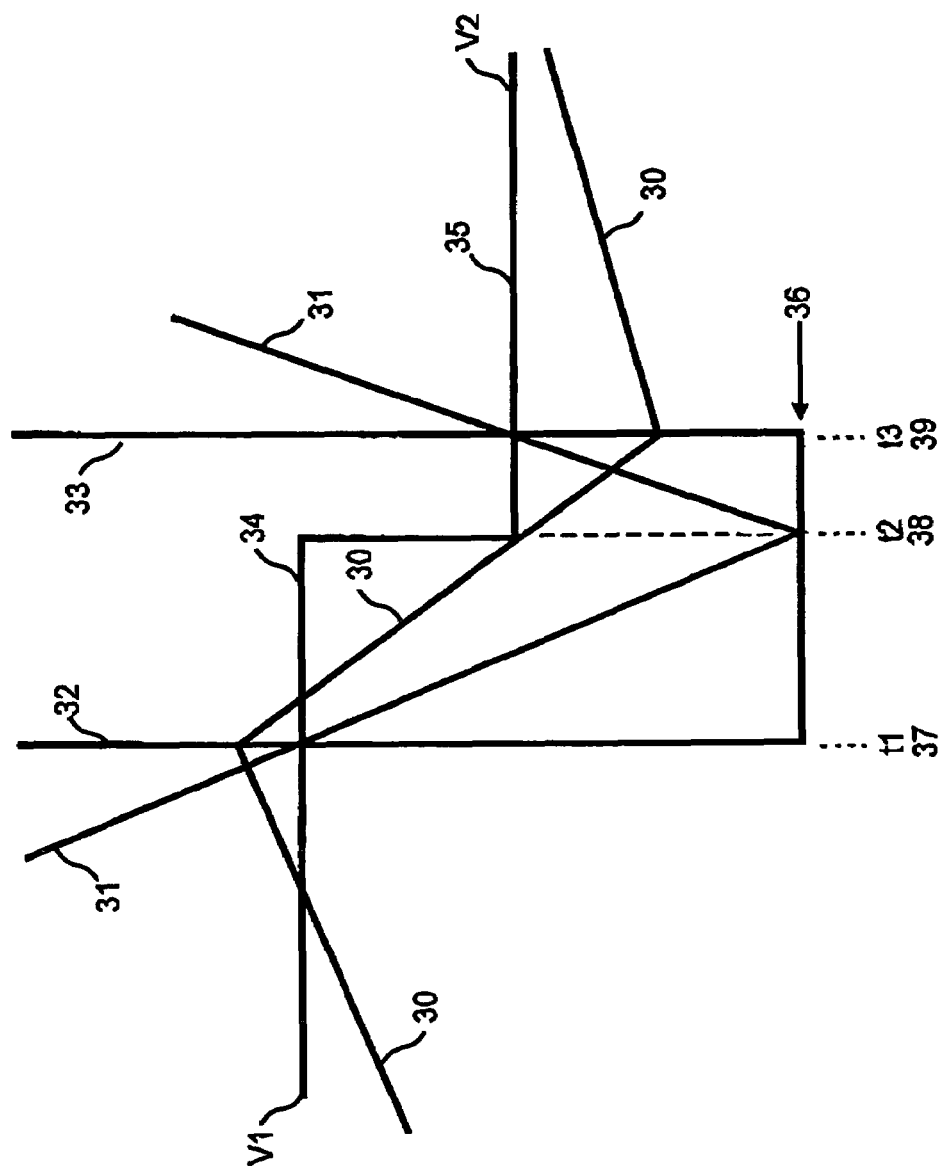
FIG. 2 shows examples of signal waveforms.

Referring to the waveform examples in FIG. 2, the output 10 of oscillator 8 produces a triangular-wave carrier reference signal 31, and also oscillator 8 produces relatively short duration sample command signal pulses at 9 close to the peaks of the triangular-wave at time t2 (38), which cause the sample and hold element 11 to sample the output signal 30 of the servo-loop amplifier. Note that the output 34 and 35 of the sample and hold element 11 alters, that is "updates" at time t2 and the signal level 35 of the output of the sample and hold element 11 after t2 approximately equals the value of the output of the servo-loop amplifier signal 30 at time t2. When the carrier reference triangular-wave signal 31 approximately equals the signal level 34 of the output of the sample and hold element 11, the comparator 15 output signal 32, 33 and 36 switches at time t1 (37) and when the carrier reference triangular-wave signal 31 approximately equals the signal level 35 of the output of the sample and hold element 11, the comparator 15 output signal 32, 33 and 36 switches at time t3 (39). This comparator response assumes an equal value of resistors 12 and 14 and zero output from first signal processor 7, in this case a linear amplifier of gain –k as shown in FIG. 1, for simplicity, but this need not be the case in general.

It is possible to produce an audio power amplifier using these techniques with similar performances to common well designed class-A, -B, or -AB analogue amplifiers.

Throughout this specification the purpose of the description has been to illustrate the invention and not to limit this.

The invention claimed is:

1. An electronic class-D amplifier including
    an amplifier input adapted to receive an amplifier input signal,
    an amplifier output adapted to produce an amplifier output signal,
    an output switching stage,
    a pulse width modulator including an oscillator and a first comparator, at least one servo-loop amplifier, having an integrating feed forward transfer function,
    the amplifier input being connected to an input of the servo-loop amplifier,
    characterised in that there is provided a sample and hold element which includes a sample input and a control input, wherein the sample and hold signal is applied to the control input, and the sample and hold element holds the value of the last sampled value of the signal at the sample input when a hold command signal is applied to the control input, and this held value is applied to an output of the sample and hold element, the amplifier input being further connected to a first input signal processor which processes the amplifier input signal, wherein a first output of the oscillator is adapted to produce a carrier reference signal, an output of the servo-loop amplifier is connected to the sample input of the sample and hold element, the output of the oscillator is connected to the control input of the sample and hold element, an output of the first input signal processor is connected to an input of the pulse width modulator, an output of the pulse width modulator is connected to an input of an output switching stage, and an output of the output switching stage is connected to the amplifier output, wherein a negative feedback path connects an output of the output switching stage to an input of the servo-loop amplifier.

2. The amplifier as in claim 1 further characterised in that the output of the sample and hold element is connected to an input of the said first comparator, and the first output of the oscillator is connected to an input of the first comparator, the said first input signal processor being a linear amplifier, and an output of the first comparator is an output of the pulse width modulator.

3. The amplifier as in claim 1 further characterised in that the sample command occurs substantially at the time at which the carrier reference signal is at a peak value and the hold command occurs at all other times.

4. The amplifier as in claim 1 further including at least one power supply which supplies power to the output switching stage said power supply adapted such that the peak signals of the carrier reference signal track a difference in potential between power supply rails which supply power to the output switching stage.

5. The amplifier as in claim 1 further characterised in that the integrating feed forward transfer function of the servo-loop amplifier is at least second order.

6. The amplifier as in claim 1 further characterised in that the amplifier input is also connected to an input of a second input signal processor, an output of the second signal processor is connected to a modulation input of the oscillator.

7. The amplifier as in claim 6 further characterised in that the second signal processor has a forward transfer function which includes a differentiating with respect to time forward transfer function with respect to time, and the signal at the modulation input of the oscillator modulates the symmetry of the carrier reference signal.

8. The amplifier as in claim 1 further characterised in that a forward gain of the output switching stage, a forward transfer function of the servo-loop amplifier, a forward gain of the sample and hold element, and modulation forward gain of the oscillator and input signal processor, and carrier reference output signal's mean frequency, and gain of the negative feedback path, and the relationship between the timing of the sample command and hold command signals relative of peaks of the carrier reference signal, are selected to improve linearity of a signal at the amplifier output relative to a signal applied to the amplifier input.

9. The amplifier as in claim 1 further characterised in that the oscillator includes a wide-band amplifier with a unity-gain-bandwidth of at least greater than 100 MHz.

10. The amplifier as in claim 1 further characterised in that a mean output carrier reference signal frequency, and peak signals from the output of the output switching stage and potential currents flowing within this stage, are consistent with class-D power audio amplification.

11. A method of amplification which includes the steps of introducing a signal to be amplified into an electronic class-D amplifier including an amplifier input adapted to receive an amplifier input signal, an amplifier output adapted to produce an amplifier output signal, an output switching stage, a pulse width modulator including an oscillator and a first comparator, at least one servo-loop amplifier, having an integrating feed forward transfer function, the amplifier input being connected to an input of the servo-loop amplifier, characterised in that there is provided a sample and hold element which includes a sample input and a control input, wherein the sample and hold signal is applied to the control input, and the sample and hold element holds the value of the last sampled value of the signal at the sample input when a hold command signal is applied to the control input, and this held value is applied to an output of the sample and hold element, the amplifier input being further connected to a first input signal processor which processes the amplifier input signal, wherein a first output of the oscillator is adapted to produce a carrier reference signal, an output of the servo-loop amplifier is connected to the sample input of the sample and hold element, the output of the oscillator is connected to the control input of the sample and hold element, an output of the first input signal processor is connected to an input of the pulse width modulator, an output of the pulse width modulator is connected to an input of an output switching stage, and an output of the output switching stage is connected to the amplifier output, wherein a negative feedback path connects an output of the output switching stage to an input of the servo-loop amplifier.

12. The amplifier as in claim 2 further characterised in that the sample command occurs substantially at the time at which the carrier reference signal is at a peak value and the hold command occurs at all other times.

13. The amplifier as in claim 2 further including at least one power supply which supplies power to the output switching stage said power supply adapted such that the peak signals of the carrier reference signal track a difference in potential between power supply rails which supply power to the output switching stage.

14. The amplifier as in claim 3 further including at least one power supply which supplies power to the output switching stage said power supply adapted such that the peak signals of the carrier reference signal track a difference in potential between power supply rails which supply power to the output switching stage.

15. The amplifier as in claim 2 further characterised in that the integrating feed forward transfer function of the servo-loop amplifier is at least second order.

16. The amplifier as in claim 3 further characterised in that the integrating feed forward transfer function of the servo-loop amplifier is at least second order.

17. The amplifier as in claim 4 further characterised in that the integrating feed forward transfer function of the servo-loop amplifier is at least second order.

18. The amplifier as in claim 2 further characterised in that the amplifier input is also connected to an input of a second input signal processor, an output of the second signal processor is connected to a modulation input of the oscillator.

19. The amplifier as in claim 3 further characterised in that the amplifier input is also connected to an input of a second input signal processor, an output of the second signal processor is connected to a modulation input of the oscillator.

20. The amplifier as in claim 4 further characterised in that the amplifier input is also connected to an input of a second input signal processor, an output of the second signal processor is connected to a modulation input of the oscillator.

21. The amplifier as in claim 5 further characterised in that the amplifier input is also connected to an input of a second input signal processor, an output of the second signal processor is connected to a modulation input of the oscillator.

* * * * *